United States Patent [19]

Doty

[11] Patent Number: 4,710,719

[45] Date of Patent: Dec. 1, 1987

[54] HIGH VOLTAGE CAPACITOR WAND FOR HIGH POWER TUNED CIRCUITS

[75] Inventor: Francis D. Doty, Columbia, S.C.

[73] Assignee: Doty Scientific, Inc., Columbia, S.C.

[21] Appl. No.: 818,486

[22] Filed: Jan. 13, 1986

[51] Int. Cl.$^4$ ............................................. G01R 33/20
[52] U.S. Cl. ..................................... 324/318; 324/322; 333/235; 334/55
[58] Field of Search ............... 324/300, 318, 321, 322, 324/307, 306; 333/235; 334/55; 128/653

[56] References Cited

U.S. PATENT DOCUMENTS 4,613,837 9/1986 Blass et al. ........................... 333/235
4,621,237 11/1986 Timms ................................. 324/322

FOREIGN PATENT DOCUMENTS 2225899 12/1973 Fed. Rep. of Germany ...... 324/322

Primary Examiner—Stewart J. Levy
Assistant Examiner—Kevin D. O'Shea

[57] ABSTRACT

Two or more high power rf capacitors are mounted on the surface of a printed circuit board that has been developed, etched, and plated to receive the capacitors and to engage mating spring contact fingers for electrical contact between the tuned circuit and the capacitors on one or both sides of the strip. An extension handle is attached to the strip to permit external insertion of the capacitor assembly into close proximity to the coil in an NMR probe, thereby permitting efficient multinuclear capability in a high power NMR probe.

3 Claims, 5 Drawing Figures

HIGH VOLTAGE CAPACITOR WAND FOR HIGH POWER TUNED CIRCUITS

FIELD OF THE INVENTION

This invention pertains to an improvement in the tunability of high power, high efficiency tuned circuits at high radio frequencies. A novel plug-in arrangement for the capacitors is described, especially for use in high power probe circuits in nuclear magnetic resonance (NMR) to facilitate multinuclear NMR probes.

PRIOR ART

A considerable amount of relevant background information on high power, high efficiency NMR probes can be found in the Journal of Magnetic Resonance 43, 399 (1981) and the references cited therein. Anderson, U.S. Pat. No. 3,771,055, describes a double and triple resonant NMR probe circuit; Gibby, Pines, and Waugh, U.S. Pat. No. 3,793,346, describe a technique requiring high power double tuned probe circuits at fixed frequencies. McKay, U.S. Pat. No. 4,446,431, describes a method of double tuning a single sample coil; one of my earlier patents, U.S. Pat. No. 4,456,882, describes a high speed spinner for high power solids applications in NMR; and another of my earlier patents, U.S. Pat. No. 4,463,328, describes a multiplely tuned coaxial resonator for NMR. No patents were discovered that dealt with the problems encountered in tuning a given channel on a high power NMR probe over a wide range of frequencies for multinuclear capability.

BACKGROUND OF THE INVENTION

It is well known that peak radio frequency voltages in the range of 2 KV to 6 KV are commonly generated across the coils and capacitors in high power NMR probes and that this necessitates components with DC breakdown voltages in the range of 10 KV to 25 KV. Rf currents are typically in the range of 10 A to 100 A. Total circuit inductance is typically in the range of 0.1 $\mu H$ to 0.5 $\mu H$ and total circuit quality factor Q is typically between 80 and 400. Hence, it is essential that the series resistance and inductance of the capacitors and the leads be kept as small as possible for optimum performance.

It is necessary to tune the resonant circuit rather precisely (within $\frac{1}{4}Q$) to the desired resonant frequency and to match the impedance to that of the transmission line, typically 50 ohms. This is commonly accomplished with high Q, high voltage variable capacitors as shown in FIG. 1, in which C3 is referred to as the tune variable and C4 is referred to as the match variable. The purpose of C1 and C2 is to serve as a capacitive voltage divider so as to permit the use of higher inductance coils, thereby reducing the effect of losses arising from lead inductance, without generating excessive voltages across the variable capacitors. Unfortunately, the tuning range of this circuit is severely limited by the introduction of C1 and C2, and multinuclear operation can only be achieved by changing their values. Of course, in low power circuits, C1 may be replaced with a short circuit, and one then has only to change C2 to effect a major change in the resonant frequency. However, as C2 becomes quite large, additional capacitance will be required in parallel with C4. Various low voltage capacitor switching means have been used commercially in this manner and for this purpose in low power probes.

Multinuclear capability can be obtained in high power tuned circuits only by the introduction into the circuit of a three-pole non-magnetic, high power, low inductance switch, able to withstand high current while being compact and having low loss, as disclosed herein.

SUMMARY OF THE INVENTION

Two or more high power rf capacitors are mounted on the surface of a printed circuit board that has been developed, etched, and plated to receive the capacitors and to engage mating spring contact fingers for electrical contact between the tuned circuit and the capacitors on one or both sides of the strip. An extension handle may be attached to the strip to permit external insertion of the capacitor assembly into close proximity to the coil in an NMR probe.

DETAILED DESCRIPTION OF THE DRAWINGS

Figure 1:
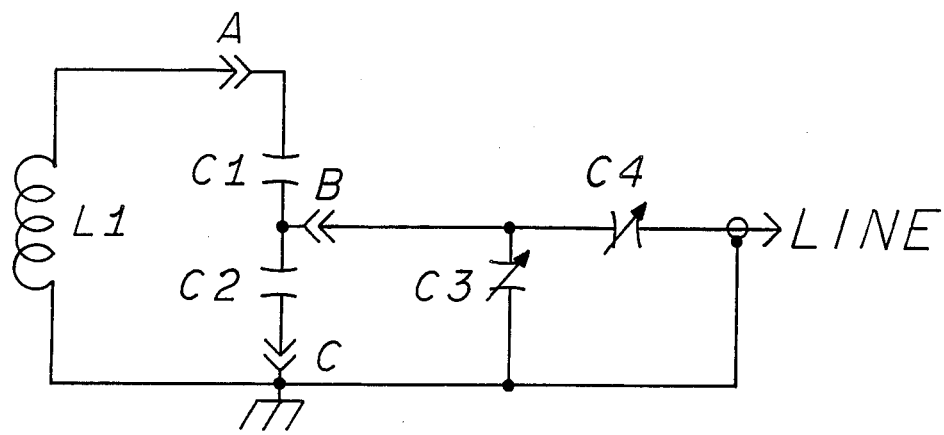
FIG. 1 is a schematic drawing of a simplified equivalent circuit in which the instant invention may be used.

FIG. 1, as mentioned above, illustrates the basic elements found in typical high power NMR probe circuits. Inductance L1 may, as in the case of a double tuned circuit, be the sum of several series inductors. The capacitors C1 and C2 may in practice be the combination of several parallel or series capacitors to achieve the necessary high Q, high current, and high voltage requirements. C3 and C4 permit limited adjustment of the resonant frequency and of the line matching impedance, generally suitable for a single nuclide, or perhaps several nuclides with nearly equal magnetogyric ratios. Full range multinuclear operation is achieved by changing the values of C1 and C2. The above mentioned stringent requirements for high performance operation have here-to-fore precluded the use of switches for the circuit contacts A, B, and C.

Figures 2A, 2B:
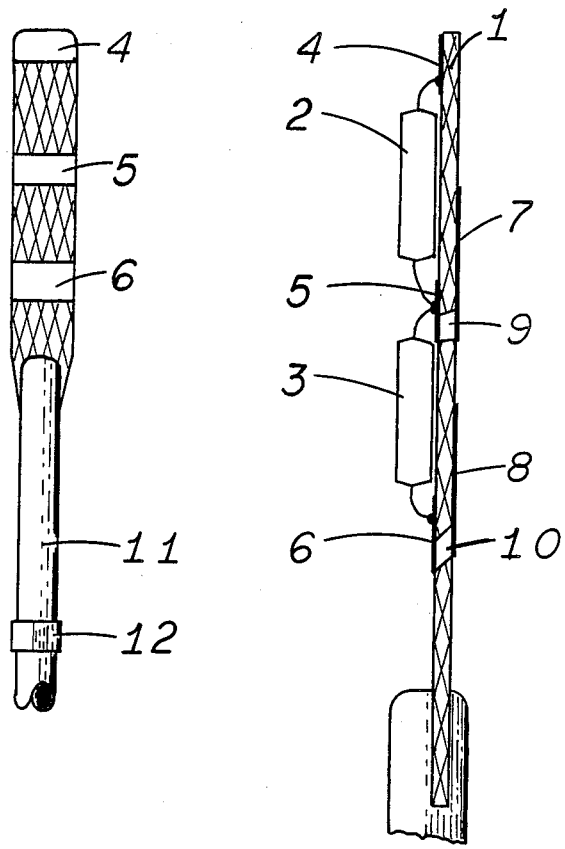
FIG. 2A is a front view of a high voltage capacitor wand.
FIG. 2B is a side view of a high voltage capacitor wand.
Figure 2C:
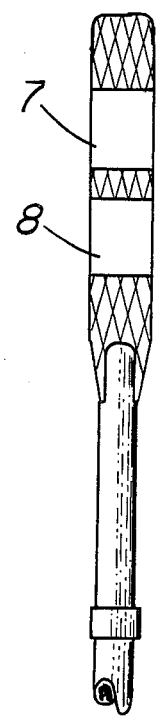
FIG. 2C is a rear view of a high voltage capacitor wand.

FIGS. 2A, 2B and 2C illustrate in front, side, and rear views respectively a suitable method of switching capacitors C1 and C2. A double sided, copper clad, fiberglass reinforced, printed circuit (p.c.) board 1 is prepared so as to receive in surface mount fashion the capacitors C1 2 and C2 3 by means of appropriate copper pads 4, 5 and 6 on the front side. Additional copper pads 7 and 8 are prepared on the rear side and electrically connected via straps 9 and 10 to pads 5 and 6 respectively to facilitate circuit contacts B and C respectively. Circuit contact A is made via pad 4 on the front side, or may be made directly to the lead of capacitor C1 if it is of a suitable material, thereby providing some mechanical stability to the wand. Pads 4, 7 and 8 are plated with a material having low contact resistance such as silver, gold, or iridium. An extension rod 11 is attached to facilitate insertion and removal of the wand. Guide sleeves 12 are mounted on the rod to locate and stabilize the wand within an appropriate guide channel to facilitate reproducable tuning.

Figure 3:
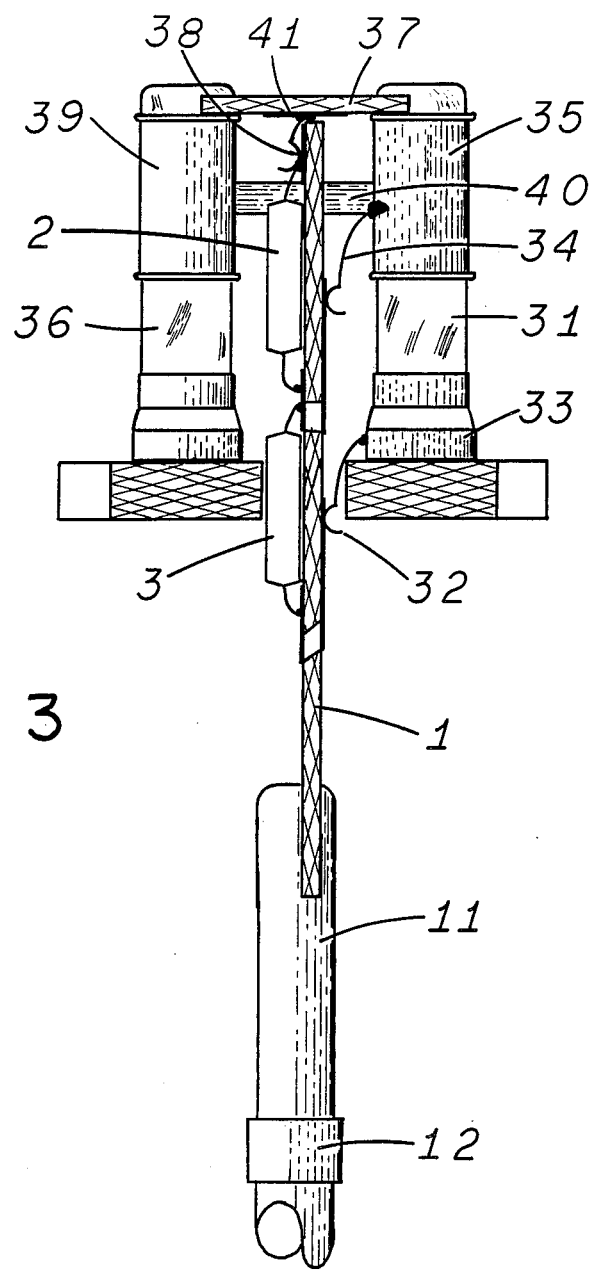
FIG. 3 illustrates in approximate scale a typical switching arrangement incorporating the high voltage capacitor wand.

FIG. 3 illustrates a typical application in which the variable capacitors are of the quartz/piston type. The tuning variable capacitor C3 31 supports the ground spring contact finger 32, circuit reference C, on its ground bushing 33, and it supports the middle spring contact finger 34, circuit reference B, on its high voltage sleeve 35. The matching variable capacitor C4 36 in cooperation with the tune variable capacitor C3 31 support an insulating support strap 37 on which is mounted the upper spring contact 38, circuit reference A. High voltage sleeves 35 and 39 are electrically connected via a conducting strap 40, adequately spaced away from the wand p.c. board 1.

The contact fingers 32, 34 and 38 are typically of silver plated beryllium copper. The insulating support strap 37 is typically of fiberglass p.c. board material with a copper pad 41 prepared to support the contact finger 38 and to connect to the high voltage side of inductor L1.

Pads 7 and 8 are positioned on the p.c. board to facilitate convenient mounting of the contact fingers while providing adequate space to prevent high voltage sparking between the various high voltage points in the circuit. (Voltages across capacitors 2 and 3 are typically 2.5 kV each.)

I claim:

1. A detachable capacitor wand for a high power NMR probe coil circuit, said wand including at least two series connected high voltage capacitors, surface mounted on one side of a removable circuit board strip, with plated copper pads provided for making low electrical resistance contacts between said circuit board strip and said probe coil circuit at the junction and at opposite ends of said series connected capacitors, said probe coil circuit including plated spring contact fingers to engage said plated pads.

2. A capacitor wand as in 1 above in which extension means are provided for insertion and removal of said wand.

3. A capacitor wand as in 1 above in which means are provided for guiding and stabilizing said wand.

* * * * *